United States Patent
Dwarakanath et al.

(10) Patent No.: US 7,948,280 B2
(45) Date of Patent: May 24, 2011

(54) CONTROLLER INCLUDING A SAWTOOTH GENERATOR AND METHOD OF OPERATING THE SAME

(75) Inventors: Mirmira Ramarao Dwarakanath, Warren, NJ (US); Jue Wang, Hillsborough, NJ (US)

(73) Assignee: Enpirion, Inc., Hampton, NJ (US)

( * ) Notice: Subject to any disclaimer, the term of this patent is extended or adjusted under 35 U.S.C. 154(b) by 0 days.

(21) Appl. No.: 11/584,721

(22) Filed: Oct. 20, 2006

(65) Prior Publication Data
US 2008/0094114 A1    Apr. 24, 2008

(51) Int. Cl.
*H03K 4/06*      (2006.01)

(52) U.S. Cl. ........................................ 327/131; 327/132

(58) Field of Classification Search ................... 327/131, 327/132–137
See application file for complete search history.

(56) References Cited

U.S. PATENT DOCUMENTS

| | | | |
|---|---|---|---|
| 4,016,461 A | 4/1977 | Roland | |
| 4,654,770 A * | 3/1987 | Santurtun et al. | 363/17 |
| 4,761,725 A | 8/1988 | Henze | |
| 4,801,816 A * | 1/1989 | Merlo et al. | 327/100 |
| 4,912,622 A | 3/1990 | Steigerwald et al. | |
| 4,982,353 A | 1/1991 | Jacob et al. | |
| 5,245,228 A | 9/1993 | Harter | |
| 5,258,662 A | 11/1993 | Skovmand | |
| 5,285,369 A | 2/1994 | Balakrishnan | |
| 5,371,415 A | 12/1994 | Dixon et al. | |
| 5,414,341 A | 5/1995 | Brown | |
| 5,469,334 A | 11/1995 | Balakrishnan | |
| 5,510,739 A | 4/1996 | Caravella et al. | |
| 5,541,541 A | 7/1996 | Salamina et al. | |
| 5,568,044 A | 10/1996 | Bittner | |
| 5,592,072 A | 1/1997 | Brown | |
| 5,594,324 A | 1/1997 | Canter et al. | |
| 5,625,312 A | 4/1997 | Kawakami et al. | |
| 5,689,213 A | 11/1997 | Sher | |
| 5,796,276 A | 8/1998 | Phillips et al. | |
| 5,864,225 A | 1/1999 | Bryson | |
| 5,877,611 A | 3/1999 | Brkovic | |
| 5,912,589 A * | 6/1999 | Khoury et al. | 330/261 |
| 5,977,811 A | 11/1999 | Magazzu | |
| 6,005,377 A | 12/1999 | Chen et al. | |
| 6,118,351 A | 9/2000 | Kossives et al. | |
| 6,169,433 B1 * | 1/2001 | Farrenkopf | 327/131 |
| 6,201,429 B1 | 3/2001 | Rosenthal | |
| 6,211,706 B1 | 4/2001 | Choi et al. | |
| 6,222,403 B1 | 4/2001 | Mitsuda | |

(Continued)

OTHER PUBLICATIONS

Zhou, X., et al., "Improved Light-Load Efficiency for Synchronous Rectifier Voltage Regulation Module," IEEE Transactions on Power Electronics, Sep. 2000, pp. 826-834, vol. 15, No. 5, IEEE, Los Alamitos, CA.

(Continued)

*Primary Examiner* — Lincoln Donovan
*Assistant Examiner* — Diana J Cheng
(74) *Attorney, Agent, or Firm* — Slater & Matsil, L.L.P.

(57) ABSTRACT

A sawtooth generator adapted to produce a sawtooth voltage, a method of operating the same, and a power converter employing the sawtooth generator and method. In one embodiment, the sawtooth generator includes a current source, coupled to a clock with a clock frequency, configured to produce a reference current proportional to the clock frequency. The sawtooth generator also includes an active network including a switch and a capacitor coupled to the current source and configured to provide a sawtooth voltage with a waveform slope produced across the capacitor substantially proportional to the reference current.

20 Claims, 7 Drawing Sheets

U.S. PATENT DOCUMENTS

| | | |
|---|---|---|
| 6,255,714 B1 | 7/2001 | Kossives et al. |
| 6,262,564 B1 | 7/2001 | Kanamori |
| 6,285,209 B1 | 9/2001 | Sawai |
| 6,285,539 B1 | 9/2001 | Kashimoto et al. |
| 6,320,449 B1 | 11/2001 | Capici et al. |
| 6,388,468 B1 | 5/2002 | Li |
| 6,407,579 B1 | 6/2002 | Goswick |
| 6,407,594 B1 | 6/2002 | Milazzo et al. |
| 6,452,368 B1 | 9/2002 | Basso et al. |
| 6,477,065 B2 | 11/2002 | Parks |
| 6,495,019 B1 | 12/2002 | Filas et al. |
| 6,541,819 B2 | 4/2003 | Lotfi et al. |
| 6,570,413 B1 | 5/2003 | Kumagai et al. |
| 6,573,694 B2 | 6/2003 | Pulkin et al. |
| 6,580,258 B2 | 6/2003 | Wilcox et al. |
| 6,639,427 B2 | 10/2003 | Dray et al. |
| 6,650,169 B2 | 11/2003 | Faye et al. |
| 6,661,216 B1 | 12/2003 | Grant et al. |
| 6,759,836 B1 | 7/2004 | Black, Jr. |
| 6,791,305 B2 | 9/2004 | Imai et al. |
| 6,822,882 B1 | 11/2004 | Jacobs et al. |
| 6,828,825 B2 | 12/2004 | Johnson et al. |
| 6,879,137 B2 | 4/2005 | Sase et al. |
| 6,922,044 B2 | 7/2005 | Walters et al. |
| 6,984,968 B2 | 1/2006 | Moon |
| 7,015,544 B2 | 3/2006 | Lotfi et al. |
| 7,019,505 B2 | 3/2006 | Dwarakanath et al. |
| 7,038,438 B2 | 5/2006 | Dwarakanath et al. |
| 7,038,514 B2 | 5/2006 | Leith et al. |
| 7,061,217 B2 | 6/2006 | Bayer et al. |
| 7,148,670 B2 | 12/2006 | Inn et al. |
| 7,190,150 B2 | 3/2007 | Chen et al. |
| 7,214,985 B2 | 5/2007 | Lotfi et al. |
| 7,230,302 B2 | 6/2007 | Lotfi et al. |
| 7,319,311 B2 | 1/2008 | Nishida |
| 7,330,017 B2 | 2/2008 | Dwarakanath et al. |
| 7,352,162 B1 | 4/2008 | Chang et al. |
| 7,482,795 B2 | 1/2009 | Parto et al. |
| 7,482,796 B2 | 1/2009 | Nishida |
| 7,501,805 B2 | 3/2009 | Chen et al. |
| 7,521,907 B2 | 4/2009 | Cervera et al. |
| 7,710,093 B2 | 5/2010 | Dwarakanath et al. |
| 7,733,072 B2 | 6/2010 | Kanakubo |
| 2002/0175661 A1 | 11/2002 | Wheeler et al. |
| 2004/0169498 A1 | 9/2004 | Goder et al. |
| 2005/0046405 A1 | 3/2005 | Trafton et al. |
| 2005/0088216 A1 | 4/2005 | Arndt et al. |
| 2005/0167756 A1 | 8/2005 | Lotfi et al. |
| 2005/0168203 A1* | 8/2005 | Dwarakanath et al. ....... 323/282 |
| 2005/0168205 A1 | 8/2005 | Dwarakanath et al. |
| 2005/0169024 A1 | 8/2005 | Dwarakanath et al. |
| 2006/0038225 A1 | 2/2006 | Lotfi et al. |
| 2006/0132217 A1* | 6/2006 | Lou et al. ............. 327/530 |
| 2007/0210777 A1 | 9/2007 | Cervera et al. |
| 2008/0018366 A1 | 1/2008 | Hanna |

OTHER PUBLICATIONS

Barrado, A., et al., "New DC/DC Converter with Low Output Voltage and Fast Transient Response," Proceedings of the IEEE Applied Power Electronics Conference, 2003, pp. 432-437, IEEE, Los Alamitos, CA.

Goder, D., et al., "V2 Architecture Provides Ultra-Fast Transient Response in Switch Mode Power Supplies," Proceedings of HFPC Power Conversion, 1996, pp. 414-420.

Patella, B.J., et al.,"High-Frequency Digital Controller IC for DC/DC Converters," IEEE Proceedings of the Applied Power Electronics Conference, Mar. 10, 2002, 7 pp., IEEE, Los Alamitos, CA.

Peterchev, A.V., et al., "Quantization Resolution and Limit Cycling in Digitally Controlled PWM Converters," IEEE Transactions on Power Electronics, Jan. 2003, pp. 301-303, vol. 18, No. 1, IEEE, Los Alamitos, CA.

Redl, R., et al., "Optimizing the Load Transient Response of the Buck Converter," Proceedings of the IEEE Applied Power Electronics Conference, 1998, pp. 170-176, IEEE, Los Alamitos, CA.

Schoneman, G.K., et al., "Output Impedance Considerations for Switching Regulators with Current-Injected Control," Proceedings of the 18th Annual IEEE Power Electronics Specialists Conference, Jun. 1987, pp. 324-335, IEEE, Los Alamitos, CA.

Soto, A., et al. "Analysis of the Buck Converter for Scaling the Supply Voltage of Digital Circuits," Proceedings of the IEEE Applied Power Electronics Conference, 2003, pp. 711-717, IEEE, Los Alamitos, CA.

Soto, A., et al., "Design Methodology for Dynamic Voltage Scaling in the Buck Converter," Proceedings of the IEEE Applied Power Electronics Conference, 2005, pp. 263-269, IEEE, Los Alamitos, CA.

Betancourt-Zamora, R.J. et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

Goodman, J. et al., "An Energy/Security Scalable Encryption Processor Using an Embedded Variable Voltage DC/DC Converter," IEEE Journal of Solid-State Circuits, Nov. 1998, vol. 33, No. 11, IEEE, Los Alamitos, CA.

Horowitz, P., et al., "The Art of Electronics," Second Edition, 1989, pp. 288-291, Cambridge University Press, Cambridge, MA.

"Linear Technology: LTC3736-1: Dual 2-Phase, No RSENSETM, Synchronous Controller with Spread Spectrum," 2004, 28 pp., Linear Technology Corporation, Milpitas, CA.

Lotfi, A.W., et al., "Issues and Advances in High-Frequency Magnetics for Switching Power Supplies," Proceedings of the IEEE, Jun. 2001, vol. 89, No. 6, pp. 833-845, IEEE, Los Alamitos, CA.

"TPS40100: Midrange Input Synchronous Buck Controller with Advanced Sequencing and Output Margining," May 2005, 37 pp., Texas Instruments Incorporated, Dallas, TX.

* cited by examiner

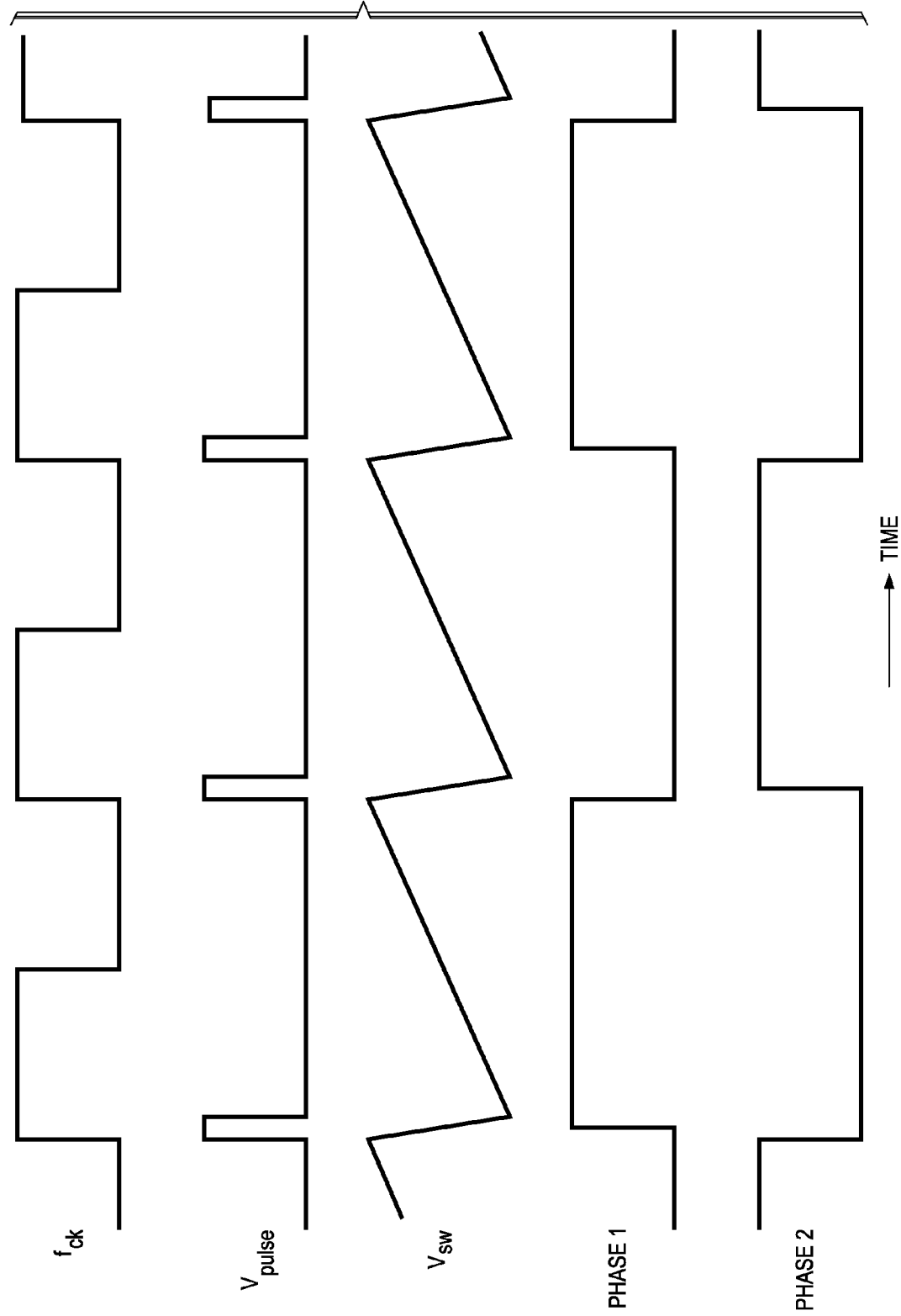

CONTROLLER INCLUDING A SAWTOOTH GENERATOR AND METHOD OF OPERATING THE SAME

TECHNICAL FIELD

The present invention is directed, in general, to power electronics and, more specifically, to a controller including a sawtooth generator, a method of operating the same, and a power converter employing the controller.

BACKGROUND

A switch mode power converter (also referred to as a "power converter") is a power supply or power processing circuit that converts an input voltage waveform into a specified output voltage waveform. Power converters are frequently employed to power loads having tight regulation characteristics such as a microprocessor with, for instance, five volts provided from a source of electrical power (e.g., a voltage source). To provide the voltage conversion and regulation functions, the power converters include active switches such as MOSFETs that are coupled to the voltage source and periodically switch a reactive circuit element such as an inductor to the voltage source at a switching frequency that may be on the order of 100 kHz to 10 MHz.

Controllers associated with the power converters manage an operation thereof by controlling the conduction periods of switches employed therein. Generally, controllers are coupled between an input and output of the power converter in a feedback loop configuration (also referred to as a "control loop" or "closed control loop").

Typically, the controller measures an output characteristic (e.g., an output voltage) of the power converter and, based thereon, modifies a duty cycle of the switches (e.g., power switches) of the power converter. The duty cycle is a ratio represented by a conduction period of a power switch to a switching period thereof. Thus, if a power switch conducts for half of the switching period, the duty cycle for the power switch would be 0.5 (or 50 percent). Additionally, as the needs for systems such as a microprocessor powered by the power converter dynamically change (e.g., as a computational load on the microprocessor changes), the controller should be configured to dynamically increase or decrease the duty cycle of the switches therein to maintain the output characteristic at a desired value.

In a typical controller for a power converter, the duty cycle is produced at a switching frequency by comparing the amplitude of a threshold voltage controlled by the feedback loop to the amplitude of a sawtooth voltage (or "sawtooth voltage waveform"). When the amplitude of the threshold voltage exceeds the amplitude of the sawtooth voltage, a power switch such as a main power switch is enabled to conduct. When the amplitude of the sawtooth voltage exceeds the amplitude of the threshold voltage, the main power switch is disabled to conduct, and another power switch such as an auxiliary power switch is typically enabled to conduct.

A controller for a power converter is typically formed as an integrated circuit, and its parameters such as the frequency and amplitude of a sawtooth voltage are not tightly controlled during circuit fabrication. When two or more power converters are used in a power conversion application, the different frequencies of operation of the converters result in beat frequencies that may be detrimental to the application at hand. In situations where the beat frequencies are undesirable, it is often necessary to synchronize the switching frequencies of the multiple power converters.

Using currently available techniques, synchronization of the switching frequencies of multiple power converters to a frequency source is readily performed in "current-mode" controllers, but not in "voltage-mode" controllers. Current-mode controllers generate a sawtooth waveform (or "sawtooth ramp") by sensing the current in a reactive circuit element such as an output filter inductor, or in the inductor's reflected current through a power transformer to a power switch, to provide feedback compensation for the slope of the sawtooth ramp. If the switching frequency is externally synchronized, the slope of the sawtooth ramp generally does not have constant amplitude, which, in the case of current-mode control, may have only a limited effect on the stability of the feedback loop including the controller. A limited range of the amplitude of the sawtooth waveform is generally acceptable in the design of current-mode controllers without substantial adverse effect on the stability of the feedback loop.

Usually the frequency of a frequency source is limited to less than 120% of the free-running frequency of an internal sawtooth waveform oscillator to limit the variation in amplitude of the sawtooth waveform. Otherwise, a proportional decrease in the amplitude of the sawtooth ramp increases the feedback gain of the controller, which may introduce a problem for feedback loop stability, as described in Texas Instruments datasheet TPS40100, entitled "Midrange Input Synchronous Buck Controller with Advanced Sequencing and Output Margining," Texas Instruments, Inc., Dallas, Tex. (2005) and in Linear Technology datasheet LTC3418, entitled "8A, 4 MHz Monolithic Synchronous Step-Down Regulator," Linear Technology Corporation, Milpitas, Calif. (2005), which are incorporated herein by reference.

Voltage-mode controllers produce a sawtooth waveform by generating a periodic voltage ramp that is substantially independent of compensating currents in a power train of a power converter. The result is a controller wherein the slope of the sawtooth voltage is independently generated, and that results in a waveform with amplitude proportional to the switching frequency, which, as described above, may be controlled by a separate frequency source. Particularly for voltage-mode controllers synchronized to a separate frequency source, it is often necessary to provide a sawtooth voltage with constant amplitude, independent of the switching frequency, to provide adequate margin for stability of the feedback loop and to preserve feedback-controlled performance characteristics of the power converter such as response time, gain and phase margins, and voltage overshoot for step changes in load or in output voltage.

Another technique to synchronize switching frequencies among multiple power converters is to use a phase-locked-loop. However, phase-locked-loops require a loop filter that is not easily integrated into an ordinary integrated circuit, which adds cost to the implementation of a controller as described in Linear Technology datasheet LTC3736-1, entitled "Dual 2-Phase, No $R_{sense}$™, Synchronous Controller with Spread Spectrum," Linear Technology Corporation, Milpitas, Calif. (2004), which is incorporated herein by reference.

Thus, as discussed above, to preserve tightly controlled feedback-controlled performance characteristics of a power converter, it is necessary to construct a sawtooth generator controlled by a separate frequency source, such as a clock, that produces a sawtooth voltage with a substantially constant amplitude independent of the frequency of a frequency source, using techniques that are easily integrable with an integrated circuit. Sawtooth generators of the prior art that produce a waveform with constant amplitude and are synchronizable to the frequency of a frequency source add measurable cost to a design of a power converter beyond the waveform sourcing functionality thereof.

Accordingly, what is needed in the art is a controller including a sawtooth generator, synchronizable to a separate frequency source, that can produce a sawtooth voltage with amplitude substantially independent of the frequency of the frequency source, that overcomes the deficiencies in the prior art.

SUMMARY OF THE INVENTION

These and other problems are generally solved or circumvented, and technical advantages are generally achieved, by advantageous embodiments of a sawtooth generator adapted to produce a sawtooth voltage, a method of operating the same, and a power converter employing the sawtooth generator and method. In one embodiment, the sawtooth generator includes a current source, coupled to a clock with a clock frequency, configured to produce a reference current proportional to the clock frequency. The sawtooth generator also includes an active network including a switch and a capacitor coupled to the current source and configured to provide a sawtooth voltage with a waveform slope produced across the capacitor substantially proportional to the reference current.

In one aspect, the present invention provides a power converter couplable to a source of electrical power adapted to provide an input voltage thereto. In one embodiment, the power converter includes a power train including a power switch coupled to the source of electrical power and configured to provide an output characteristic therefrom. The power converter also includes a controller configured to provide a signal to control a duty cycle of the power switch. The controller includes a feedback amplifier configured to receive the output characteristic and a reference signal and produce a threshold signal. The controller also includes a waveshaping circuit configured to receive a synchronization signal and produce phase signals therefrom. The controller also includes a sawtooth generator adapted to receive the phase signals and produce a sawtooth voltage. The sawtooth generator includes a current source configured to produce a reference current proportional to a frequency of the synchronization signal, and an active network including a switch and a capacitor coupled to the current source and configured to provide the sawtooth voltage with a waveform slope produced across the capacitor substantially proportional to the reference current. The controller also includes a comparator configured to provide the signal to control the duty cycle as a function of the sawtooth voltage and the threshold signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which:

FIG. 7 illustrates an exemplary timing diagram demonstrating an exemplary operation of a switched capacitor circuit according to the principles of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a sawtooth generator for a power converter that can be synchronized to a frequency source that produces a sawtooth voltage of substantially constant amplitude being substantially independent of frequency, a method of producing a synchronizable sawtooth voltage with a substantially constant amplitude being substantially independent of frequency for a power converter, and a power converter employing the same. The principles of the present invention, however, may also be applied to all types of power converters employing various conversion topologies that may benefit from a sawtooth generator that produces a sawtooth voltage of substantially constant amplitude synchronized to the frequency of a frequency source.

Figure 1:
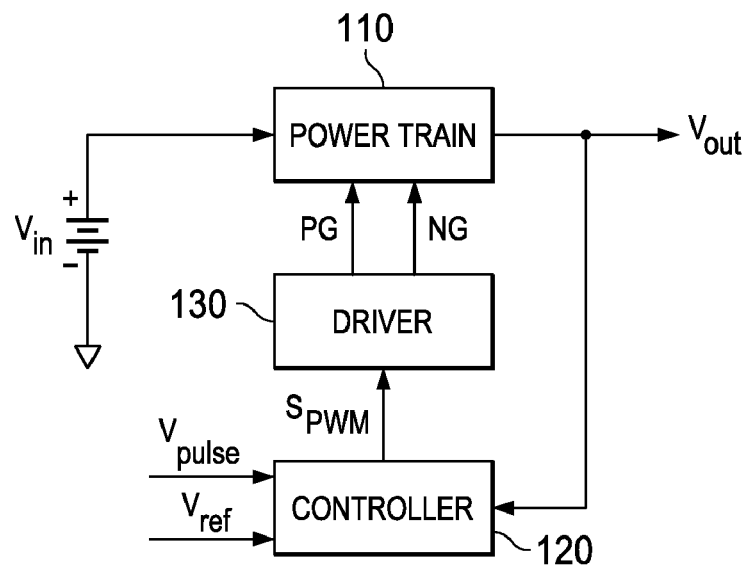
FIG. 1 illustrates a block diagram of an embodiment of a power converter constructed according to the principles of the present invention.

Referring initially to FIG. 1, illustrated is a block diagram of an embodiment of a power converter constructed according to the principles of the present invention. The power converter includes a power train 110 coupled to a source of electrical power (represented by a battery) for providing an input voltage $V_{in}$ for the power converter. The power converter also includes a controller 120 and a driver 130, and provides power to a system (not shown) such as a microprocessor coupled to an output thereof. The power train 110 may employ a buck converter topology as illustrated and described with respect to FIG. 2 below. Of course, any number of converter topologies may benefit from the use of a controller 120 constructed according to the principles of the present invention and are well within the broad scope of the present invention.

The power train 110 receives an input voltage $V_{in}$ at an input thereof and provides a regulated output characteristic (e.g., an output voltage $V_{out}$) to power a microprocessor or other load coupled to an output of the power converter. The controller 120 may be coupled to a voltage reference $V_{ref}$ representing a desired characteristic such as a desired system voltage from an internal or external source associated with the microprocessor, and to the output voltage $V_{out}$ of the power converter. The controller may also be coupled to a synchronization waveform $V_{pulse}$ to synchronize the switching cycle of the power converter to an internal or an external clock. In accordance with the aforementioned characteristics, the controller 120 provides a control signal $S_{PWM}$ to control a duty cycle and a frequency of at least one power switch of the power train 110 to regulate the output voltage $V_{out}$ or another characteristic thereof.

In accordance with the aforementioned characteristics, a drive signal(s) [e.g., a first gate drive signal PG with duty cycle D functional for a P-channel MOSFET ("PMOS") power switch and a second gate drive signal NG with complementary duty cycle 1-D functional for a N-channel MOSFET ("NMOS") power switch] is provided by the driver 130 to control a duty cycle and a frequency of one or more power switches of the power converter, preferably to regulate the output voltage $V_{out}$ thereof. For a PMOS power switch or PMOS switch, a gate drive signal is typically driven negative to turn on the PMOS switch, and for an NMOS power switch or NMOS switch, a gate drive signal is typically driven positive to turn on the NMOS switch.

Figure 2:
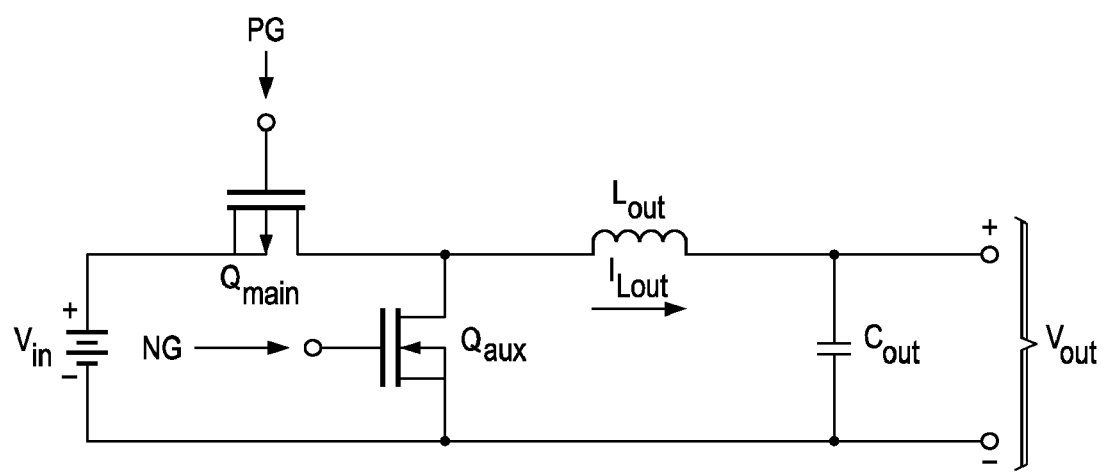
FIG. 2 illustrates a schematic diagram of an embodiment of a power train of a power converter constructed according to the principles of the present invention.

Turning now to FIG. 2, illustrated is a schematic diagram of an embodiment of a power train of a power converter constructed according to the principles of the present invention. While in the illustrated embodiment the power train employs a buck converter topology, those skilled in the art should understand that other converter topologies such as a forward converter topology or an active clamp topology are well within the broad scope of the present invention.

The power train of the power converter receives an input voltage $V_{in}$ (e.g., an unregulated input voltage) from a source of electrical power (represented by a battery) at an input thereof and provides a regulated output voltage $V_{out}$ to power, for instance, a microprocessor at an output of the power converter. In keeping with the principles of a buck converter topology, the output voltage $V_{out}$ is generally less than the input voltage $V_{in}$ such that a switching operation of the power converter can regulate the output voltage $V_{out}$. A main power switch $Q_{main}$ (e.g., a PMOS switch) is enabled to conduct by a gate drive signal PG for a primary interval (generally co-existent with a duty cycle "D" of the main power switch $Q_{main}$) and couples the input voltage $V_{in}$ to an output filter inductor $L_{out}$. During the primary interval, an inductor current $I_{Lout}$ flowing through the output filter inductor $L_{out}$ increases as a current flows from the input to the output of the power train. An ac component of the inductor current $I_{Lout}$ is filtered by an output capacitor $C_{out}$.

During a complementary interval (generally co-existent with a complementary duty cycle "1-D" of the main power switch $Q_{main}$), the main power switch $Q_{main}$ is transitioned to a non-conducting state and an auxiliary power switch $Q_{aux}$ (e.g., an NMOS switch) is enabled to conduct by a gate drive signal NG. The auxiliary power switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary power switches $Q_{main}$, $Q_{aux}$ may be adjusted to maintain a regulation of the output voltage $V_{out}$ of the power converter. Those skilled in the art should understand, however, that the conduction periods for the main and auxiliary power switches $Q_{main}$, $Q_{aux}$ may be separated by a small time interval to avoid cross conduction therebetween and, beneficially, to reduce the switching losses associated with the power converter.

Figure 3:
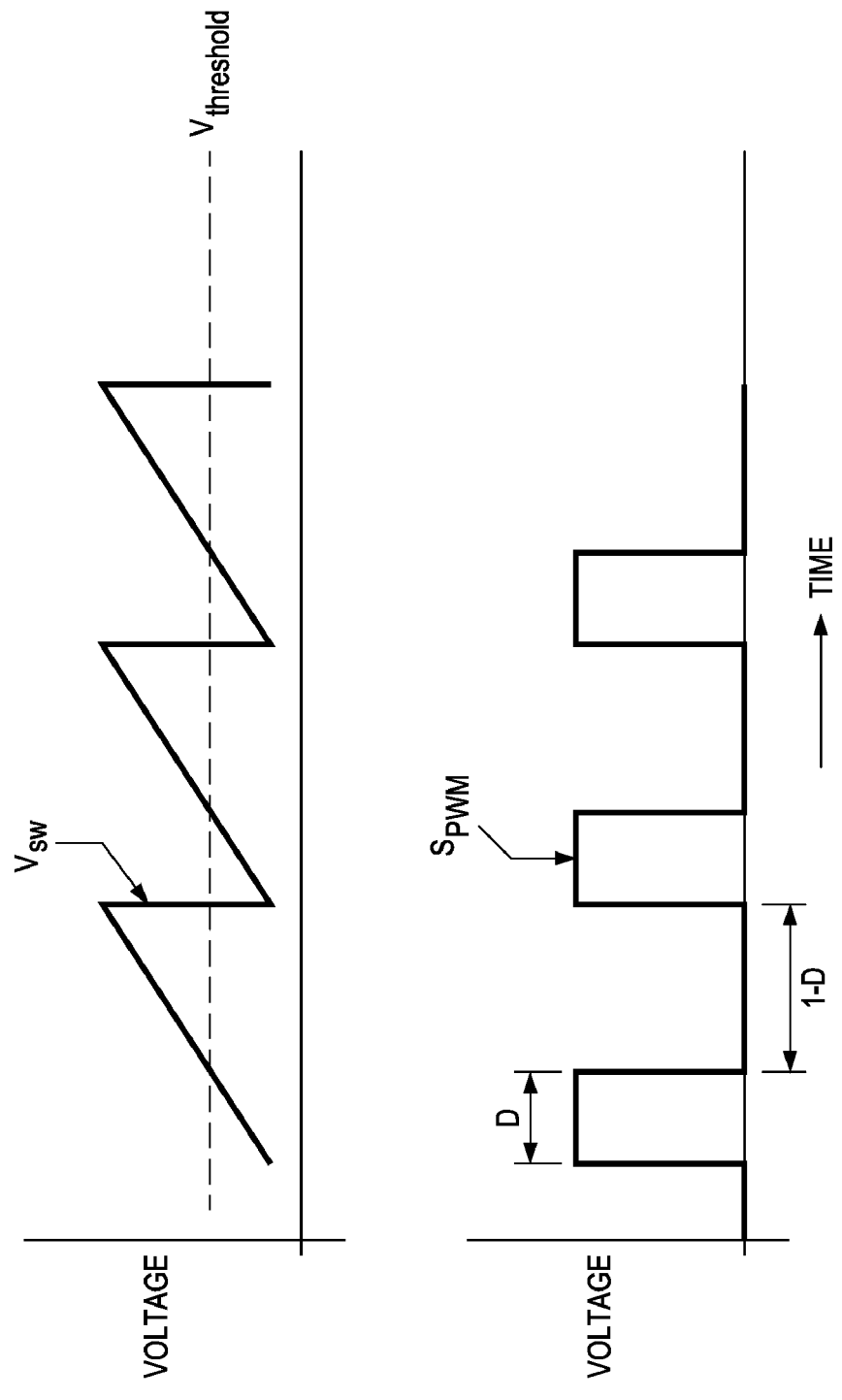
FIG. 3 illustrates a timing diagram showing a duty cycle signal conventionally produced by comparing a threshold voltage level to a sawtooth voltage.

Turning now to FIG. 3, illustrated is a timing diagram showing a duty cycle signal (e.g., control signal $S_{PWM}$) conventionally produced by comparing a threshold voltage level $V_{threshold}$ to a sawtooth voltage $V_{sw}$. When the threshold voltage level $V_{threshold}$ exceeds the sawtooth voltage $V_{sw}$, the duty cycle signal $S_{PWM}$ is raised to its high level, thereby controlling a duty cycle "D" for a power switch in a power converter. Alternatively, when the sawtooth voltage $V_{sw}$ exceeds the threshold voltage level $V_{threshold}$, the duty cycle signal $S_{PWM}$ is reduced to its low level, providing the complementary portion "1-D" of the duty cycle for a power switch in the power converter. In this manner, a control signal is generally developed to enable conduction in, for instance, a main power switch of a power converter.

Figure 4:
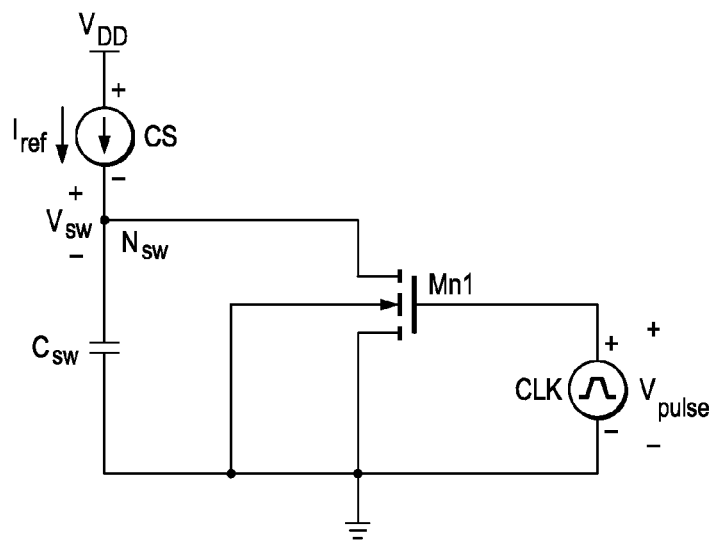
FIG. 4 illustrates a schematic diagram of a conventional sawtooth generator.

Turning now to FIG. 4, illustrated is a schematic diagram of a conventional sawtooth generator. A capacitor $C_{sw}$ is connected to a current source CS and to a switch Mn1 controlled by a voltage from a signal generator (e.g., a clock) CLK that provides a synchronization signal $V_{pulse}$ coupled to a control terminal of the switch Mn1 (e.g., a gate of a field-effect transistor). The current source CS is also coupled to an input voltage source (generally designated $V_{DD}$) from which it receives a source of electrical power. When the switch Mn1 is disabled to conduct (i.e., open), a reference current $I_{ref}$ from the current source CS charges the capacitor $C_{sw}$ at a constant rate of change of a voltage according to:

$$\frac{d}{dt}(V_{sw}) = \frac{I_{ref}}{C_{sw}}.$$

When the switch Mn1 is enabled to conduct (i.e., closed), preferably for a brief time period relative to the time interval when the switch Mn1 is disabled to conduct, the capacitor $C_{sw}$ is rapidly discharged to ground, and a voltage at the node $N_{sw}$ is substantially equal to zero volts. By periodically opening and closing the switch Mn1, a sawtooth voltage $V_{sw}$ is generated at the node $N_{sw}$.

Figure 5:
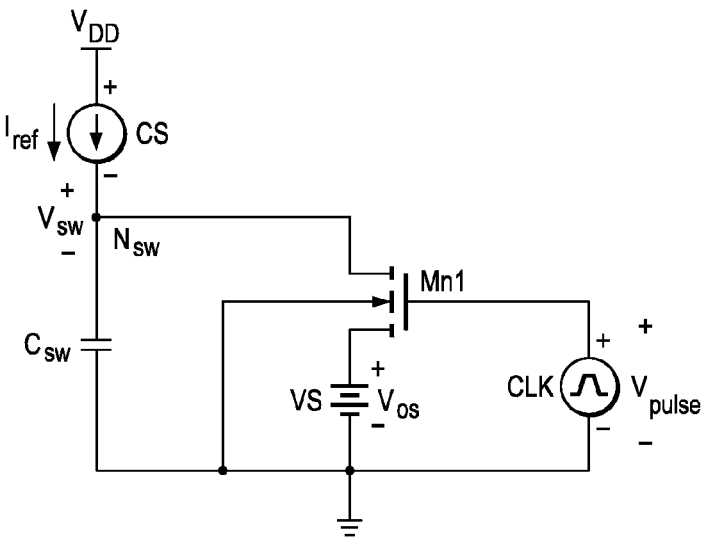
FIG. 5 illustrates a schematic diagram of an embodiment of a sawtooth generator according to the principles of the present invention.

Turning now to FIG. 5, illustrated is a schematic diagram of an embodiment of a sawtooth generator according to the principles of the present invention with a voltage source (represented by a battery and generally designated VS) coupled in series with the source terminal of a switch Mn1 to provide an offset voltage $V_{os}$ for a sawtooth voltage $V_{sw}$ relative to ground. When the switch Mn1 is enabled to conduct, preferably for a brief time period relative to the time interval when the switch Mn1 is disabled to conduct, the capacitor $C_{sw}$ is discharged to the offset voltage $V_{os}$. When the switch Mn1 is disabled to conduct, the sawtooth voltage $V_{sw}$ at a node $N_{sw}$ ramps up from the offset voltage $V_{os}$ to a voltage represented by $V_{os}+\Delta V$, which is dependent on the duration of the time interval that the switch Mn1 is disabled to conduct and, as a result, on the frequency of the resulting waveform. The remaining elements in FIG. 5 that are similar to elements in FIG. 4 will not be described again in the interest of brevity.

A signal at the control terminal of the switch Mn1 (e.g., the gate of a field-effect transistor) is readily synchronized to a frequency source such as an internal or external clock CLK. In this manner, the sawtooth voltage $V_{sw}$ may be synchronized to an internal or external frequency reference. In addition, the amplitude of the sawtooth voltage $V_{sw}$ should be controlled (e.g., tightly controlled) as it affects the gain and thus the stability of the control loop. The portion of the amplitude $\Delta V$ of the sawtooth voltage $V_{sw}$ is given by:

$$\Delta V = \frac{I_{ref}}{C_{sw}} \cdot T_{off},$$

wherein $T_{off}$ is the off time of the switch Mn1. If the RC time constant of the capacitance of the capacitor $C_{sw}$ times the on resistance of the switch Mn1 is small compared to the period of the clock CLK (e.g., the switching period of a power converter), a narrow pulse may be applied to control the switch Mn1 which is long enough to discharge the capacitor $C_{sw}$ to the offset voltage $V_{os}$.

Assuming that the off time $T_{off} \approx T_{ck}$, where $T_{ck}$ is the period of the clock CLK (i.e., the switch Mn1 is preferably enabled to conduct for a time period substantially shorter than the period $T_{ck}$ of the clock CLK), the portion of the amplitude $\Delta V$ of the sawtooth voltage $V_{sw}$ is given by the equation:

$$\Delta V = \frac{I_{ref}}{C_{sw} \cdot f_{ck}},$$

where $f_{ck}$ is the frequency of the clock CLK. It is not essential that the on time $T_{on}$ of the switch Mn1 be much smaller than the period $T_{ck}$ of the clock CLK; it is only preferable that the on time $T_{on}$ be a substantially fixed fraction of the period $T_{ck}$ of the clock CLK. In order to keep the amplitude $\Delta V$ substantially constant as the frequency $f_{ck}$ varies, it is preferable to make the reference current $I_{ref}$ proportional to the frequency $f_{ck}$ of the clock CLK in view of the substantially constant capacitance of the capacitor $C_{sw}$. A consequence of the reference current $I_{ref}$ being proportional to the frequency $f_{ck}$ of the clock CLK is that a waveform slope of the sawtooth voltage $V_{sw}$ produced across the capacitor $C_{sw}$ is substantially proportional to the reference current $I_{ref}$.

Figure 6A:
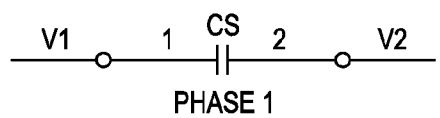
FIGS. 6A and 6B illustrate diagrams of an embodiment of a switched capacitor circuit in accordance with the principles of the present invention.
Figure 6B:
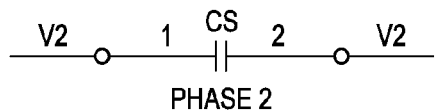

Turning now to FIGS. 6A and 6B, illustrated are diagrams of an embodiment of a switched capacitor circuit in accordance with the principles of the present invention. The switched capacitor circuit of the present invention is constructed as follows to approximate a "resistor" of value R=1/ ($C_{sw} \cdot f_{ck}$) and is employable to establish the current source as described above: Each clock cycle is divided into two non-overlapping phases as illustrated in FIGS. 6A and 6B. During Phase 1, a switched capacitor Cs is quickly charged to a voltage (V1−V2). The charge stored in the switched capacitor Cs is equal to Cs·(V1−V2). During Phase 2, terminal 1 of the switched capacitor Cs is connected to the voltage V2 and the other terminal is also connected to the same voltage V2. The switched capacitor Cs is thereby quickly essentially fully discharged. Using a clock signal synchronized to a clock (see, e.g., FIG. 5), the time-averaged discharge current $I_{avg}$ (analogous to the reference current $I_{ref}$ described above) from the switched capacitor Cs is given by:

$$I_{avg} = Cs \cdot (V1-V2) \cdot f_{ck},$$

which is proportional, as desired, to the clock frequency $f_{ck}$. Thus, the switched capacitor Cs is switched at a clock frequency $f_{ck}$ to produce a current (employable as a reference current) proportional to the clock frequency $f_{ck}$.

Turning now to FIG. 7, illustrated is an exemplary timing diagram demonstrating an exemplary operation of a switched capacitor circuit according to the principles of the present invention. In FIG. 7, a clock frequency $f_{ck}$ represents a signal from a clock (see, e.g., FIG. 5). A synchronization signal $V_{pulse}$ is a narrow-pulsed waveform derived from the clock frequency $f_{ck}$ that is used to control the switch Mn1, as illustrated and described with reference to FIGS. 4 and 5. A sawtooth voltage $V_{sw}$ represents the sawtooth voltage waveform across the switched capacitor Cs. The phase signals designated Phase 1 and Phase 2 represent the timing of phases Phase 1 and Phase 2 for charging and discharging of the switched capacitor Cs. The phases can be readily produced from the synchronization signal $V_{pulse}$ with a clocked T flip-flop using techniques well-known in the art.

Figure 8:
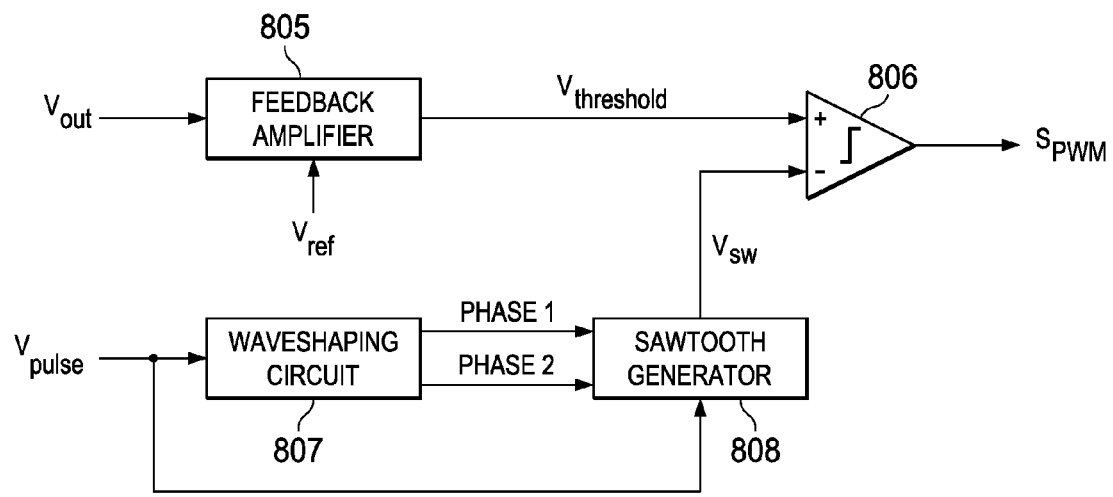
FIG. 8 illustrates a block diagram of an embodiment of a controller according to the principles of the present invention.

Turing now to FIG. 8, illustrated is a block diagram of an embodiment of a controller according to the principles of the present invention. The controller is coupled to an output terminal of a power train to sense an output characteristics such as output voltage $V_{out}$ and produce a control signal (also referred to as a "duty cycle signal") $S_{PWM}$. The output characteristic is coupled to a feedback amplifier 805, which produces a threshold signal such as a threshold voltage ($V_{threshold}$, previously described with reference to FIG. 3) that is coupled to a noninverting input of a comparator 806. The feedback amplifier 805 is also coupled to a reference signal such as a reference voltage $V_{ref}$ that sets the desired level of the output characteristic of the power converter, such as the output voltage $V_{out}$. A switching frequency synchronization signal $V_{pulse}$ is coupled to a waveshaping circuit 807, which produces the phase signals designated Phase 1 and Phase 2, described previously with reference to FIGS. 6A, 6B, and 7. The phase signals Phase 1, Phase 2 are coupled to a sawtooth generator 808 that produces the sawtooth voltage or sawtooth voltage waveform $V_{sw}$ by controlling the current level of a reference current source to be proportional to a frequency of the synchronization signal $V_{pulse}$. The sawtooth voltage $V_{sw}$ is coupled to the inverting input of the comparator 806.

Figure 9:
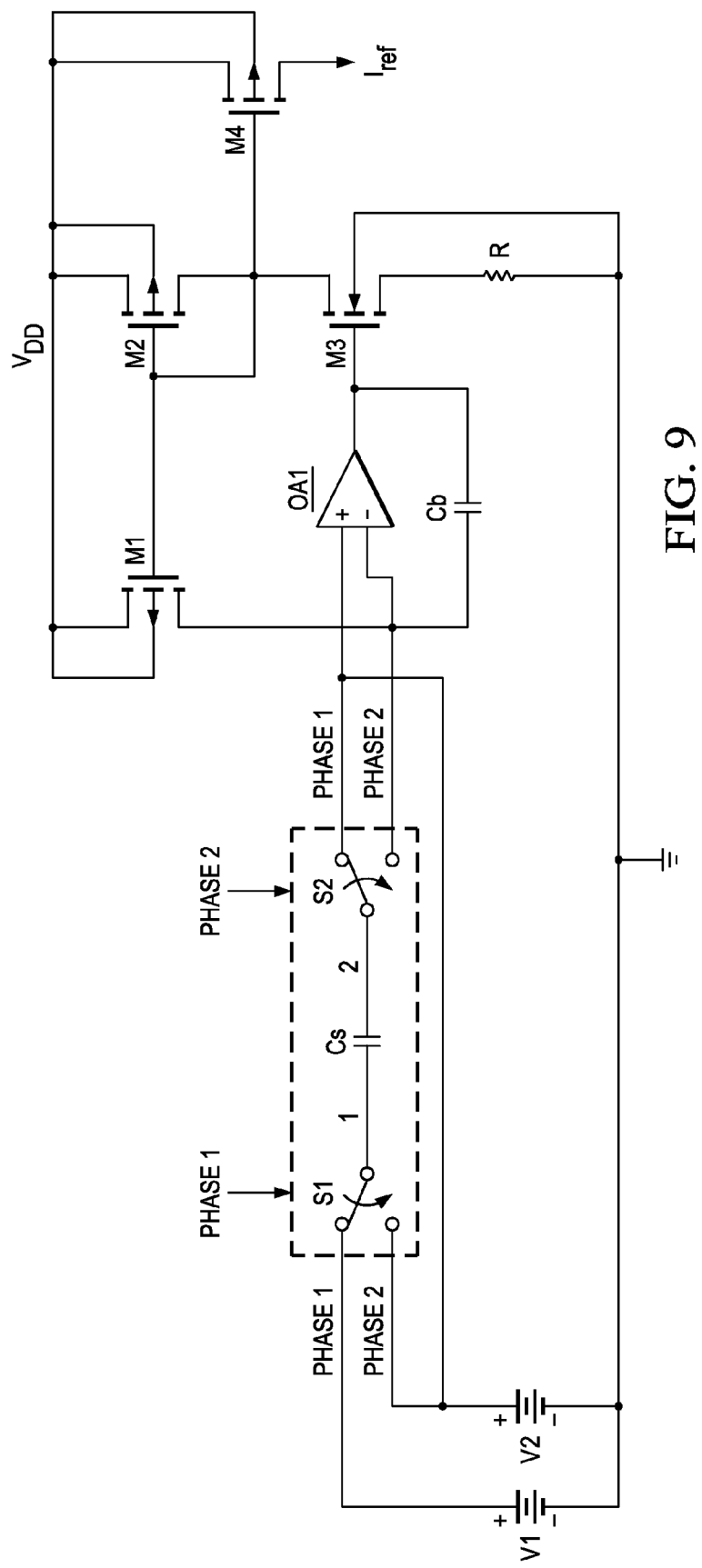
FIGS. 9 and 10 illustrate schematic diagrams of embodiments of current sources according to the principles of the present invention.

Turing now to FIG. 9, illustrated is a schematic diagram of an embodiment of a current source to generate a reference current $I_{ref}$ from an input voltage source $V_{DD}$ with average value of current proportional to a clock frequency $f_{ck}$ according to the principles of the present invention. The phase signals Phase 1, Phase 2 are generated from the synchronization signal $V_{pulse}$ previously described by a waveshaping circuit such as the waveshaping circuit 807 described above with reference to FIG. 8. Preferably, the voltages at the two inputs of an operational amplifier OA1 are both equal to V2, due to the high gain of the operational amplifier OA1 and the feedback arrangement coupled to the inverting input.

During Phase 1, the switched capacitor Cs is connected by the switches S1 and S2 between the voltages V1 and V2 (represented by batteries) and is charged up to the voltage (V1−V2). During Phase 2, the charge stored in the switched capacitor Cs is transferred to a feedback capacitor Cb. If the voltage V1 is greater than the voltage V2, an amount of charge equal to Cs·(V1−V2) is extracted from the feedback capacitor Cb coupled to the inverting terminal of the operational amplifier OA1, causing an output thereof to increase by a voltage increment $\Delta Vo = -(Cs/Cb) \cdot (V1-V2)$. This in turn causes the currents in the switches M1, M2, M3 to decrease. The gate and source terminals of the switches M1, M2 are coupled together to form a current mirror. The decreased current flowing from the switch M1 out of the feedback capacitor Cb causes the voltage at the output of the operational amplifier OA1 to increase, thereby establishing negative feedback. In the steady state, a current:

$$IM1 = Cs \cdot \frac{(V1 - V2)}{T_{ck}}$$

flows in the switch M1 from source to drain.

The feedback capacitor Cb integrates the currents and reduces the high-frequency ripple at the output resulting from the current spikes produced by the switched capacitor Cs. The feedback capacitor Cb around the operational amplifier OA1 aids in suppressing the current pulses. In the steady state, the switch M1 delivers a current that is equal but opposite in sign to the current in the feedback capacitor Cb and that is the average current delivered by the switched capacitor Cs. The currents in the switches M2, M4 are proportional to the current in the switch M1, due to the operation of the current mirror. The value of the current from the reference current $I_{ref}$ is given by:

$$I_{ref} = Cs \cdot (V1 - V2) \cdot f_{ck} \cdot \frac{\left(\frac{W}{L}\right)_{M4}}{\left(\frac{W}{L}\right)_{M1}},$$

where W/L represents the width-to-length ratio for the device layout in an integrated circuit for the switches M4, M1, respectively, as indicated in the equation above. A resistor R enables production of a current in the switch M3 proportional to the gate voltage of the switch M3.

Figure 10:
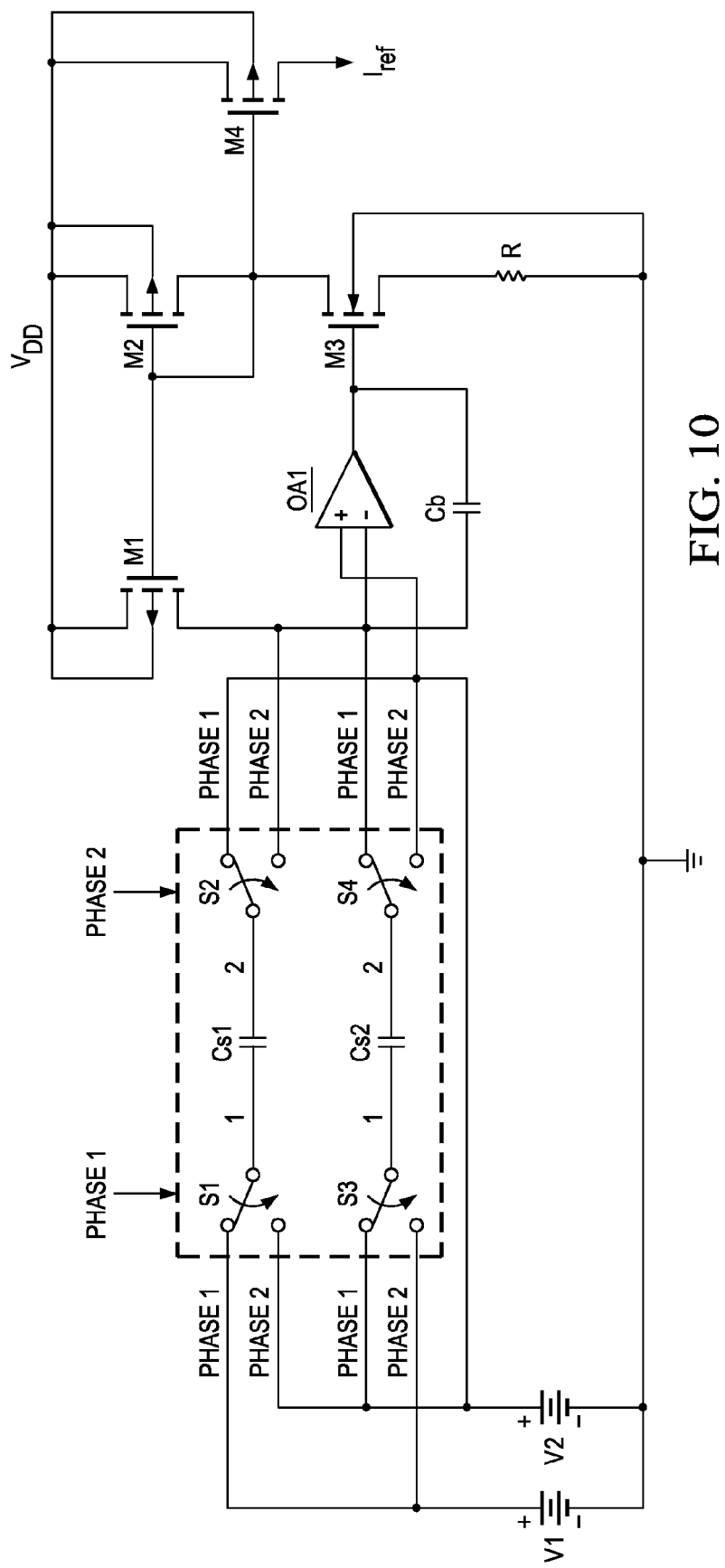

The amplitude of the sawtooth voltage produced by a circuit such as illustrated in FIGS. 3 or 4 coupled to a current source such as illustrated in FIGS. 9 and 10 is given by:

$$\Delta V = \frac{Cs}{C_{sw}} \cdot (V1 - V2) \cdot \frac{\left(\frac{W}{L}\right)_{M4}}{\left(\frac{W}{L}\right)_{M1}},$$

which is substantially independent of the clock frequency $f_{ck}$. The sawtooth voltage is also synchronized to a clock. Capacitor and transistor ratios are accurately realized in integrated circuits such as silicon integrated circuits, thereby helping to keep $\Delta V$ constant as the frequency is tuned.

To reduce the switching ripple even further and to realize a steadier current source, a second switched capacitor Cs2 that conducts out of phase (e.g., 180 degrees out of out of phase) with the first switched capacitor Cs1 may be added with the switches S3 and S4 as illustrated in FIG. 10. During Phase 1, the first switched capacitor Cs1 is charged while the second switched capacitor Cs2 is discharged. During Phase 2, the first switched capacitor Cs1 is discharged while the second switched capacitor Cs2 is charged. If the switched capacitors Cs1, Cs2 are of equal capacitance, which is a preferred condition to minimize ripple in the reference current $I_{ref}$, then the reference current $I_{ref}$ is twice the value previously computed above [i.e., a current is now produced proportional to the sum of capacitances (Cs1+Cs2)]. The remaining elements in FIG. 10 that are similar to corresponding elements in FIG. 9 will not be described in the interest of brevity Thus, a circuit and related method of generating a sawtooth voltage synchronized to a clock signal and having amplitude substantially independent of frequency with readily attainable and quantifiable advantages has been introduced. Generating a sawtooth voltage with amplitude advantageously and substantially independent of frequency is an important property and design consideration in power converter applications to maintain a constant loop gain for the overall system, particularly in voltage-mode dc-dc power converter applications. The implementation provides a circuit technique to generate the sawtooth voltage employing no external components for an integrated circuit design. The operation of the circuit is robust and does not occupy substantial silicon area.

In one embodiment as described herein, the sawtooth generator includes a current source coupled to a clock with a clock frequency, wherein the current source produces a reference current proportional to the clock frequency. The sawtooth generator produces the sawtooth voltage in response to the reference current. In a preferred embodiment, the sawtooth generator includes an active network including a switch and a capacitor coupled to the current source, wherein the sawtooth voltage produced across the capacitor has a waveform slope substantially proportional to the reference current. In a preferred embodiment, the switch is enabled to conduct in response to a signal from the clock to discharge the capacitor. In a further preferred embodiment, the current source includes a switched capacitor circuit including a first capacitor switched at the clock frequency to produce the reference current proportional to the clock frequency. In a further preferred embodiment, the switched capacitor circuit includes a second capacitor switched out of phase with the first capacitor to produce the reference current with reduced ripple. In a further preferred embodiment, the current source includes a current mirror coupled to the switched capacitor circuit to produce the reference current. In a further preferred embodiment, the sawtooth generator includes a voltage source coupled in series with the switch to produce the sawtooth voltage with a dc offset voltage.

In another aspect, the present invention provides a method of producing a sawtooth voltage with substantially constant amplitude substantially independent of waveform frequency, wherein the sawtooth voltage is synchronizable to a frequency source. In one embodiment, the method includes coupling a current source to a clock with a clock frequency, and producing a reference current proportional to the clock frequency. The method further includes producing the sawtooth voltage waveform from the reference current. In a preferred embodiment, the sawtooth generator includes forming an active network including a switch and a capacitor, and coupling the active network to the current source to produce the sawtooth voltage across the capacitor with a waveform slope substantially proportional to the reference current. In a preferred embodiment, the method includes enabling the switch to conduct in response to a signal from the clock to discharge the capacitor. In a further preferred embodiment, the method further includes forming the current source with a switched capacitor circuit, and switching a first capacitor in the switched capacitor circuit at the clock frequency to produce the reference current proportional to the clock frequency. In a further preferred embodiment, the method includes switching a second capacitor in the switched capacitor circuit out of phase with the first capacitor to produce the reference current with reduced ripple. In a further preferred embodiment, the method includes coupling a current mirror to the switched capacitor circuit to produce the reference current. In a further preferred embodiment, the method includes coupling a voltage source in series with the switch to produce the sawtooth voltage with a dc offset voltage.

In another aspect, the present invention provides a power converter couplable to a source of electrical power adapted to provide an input voltage thereto. In one embodiment, the power converter includes a power train including a power switch configured to conduct for a duty cycle and provide a regulated output characteristic at an output of the power converter. The power converter also includes a controller configured to provide a signal to control a duty cycle of the power switch. The controller includes a sawtooth generator to produce a sawtooth voltage waveform with a substantially constant amplitude being substantially independent of frequency. The sawtooth voltage is synchronizable to a frequency source. In one embodiment, the sawtooth generator includes a current source coupled to a clock with a clock frequency, wherein the current source produces a reference current proportional to the clock frequency. The sawtooth generator produces the sawtooth voltage in response to the reference current. In a preferred embodiment, the sawtooth generator includes an active network including a switch and a capacitor coupled to the current source, wherein the sawtooth voltage produced across the capacitor has a waveform slope substantially proportional to the reference current. In a preferred embodiment, the switch is enabled to conduct in response to a signal from the clock to discharge the capacitor. In a further preferred embodiment, the current source includes a switched capacitor circuit including a first capacitor switched at the clock frequency to produce the reference current proportional to the clock frequency. In a further preferred embodiment, the switched capacitor circuit includes a second capacitor switched out of phase with the first capacitor to produce the reference current with reduced ripple. In a further preferred embodiment, the current source includes a current mirror coupled to the switched capacitor circuit to produce the reference current. In a further preferred embodiment, the sawtooth generator includes a voltage source coupled in series with the switch to produce the sawtooth voltage with a dc offset voltage.

Those skilled in the art should understand that the previously described embodiments of the generator, controller, related methods, and power converter employing the same are submitted for illustrative purposes only and that other embodiments capable of producing a sawtooth voltage with substantially constant amplitude, synchronized to a clock signal, are well within the broad scope of the present invention. Thus, a sawtooth generator according to the principles of the present invention may be advantageously included in the design of a power converter.

Additionally, in an advantageous embodiment, a controller for a power converter constructed according to the principles of the present invention may be embodied in an integrated circuit, with little incremental size and cost for the power converter. Alternatively, portions of the controller may also be embodied in an integrated circuit and still be within the broad scope of the present invention. As a result, the controller can be employed in various applications including conditions wherein the size and cost of the controller are important competitive or application factors.

Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. The principles of the present invention may be applied to a wide variety of power converter topologies. While the controller and sawtooth generator have been described in the environment of a power converter, those skilled in the art should understand that the controller and sawtooth generator and related principles of the present invention may be applied in other environments or applications such as a power amplifier, motor controller, and a system to control an actuator in accordance with a stepper motor or other electromechanical device.

For a better understanding of power converters see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Although the present invention has been described in detail, those skilled in the art should understand that they can make various changes, substitutions and alterations herein without departing from the spirit and scope of the invention in its broadest form.

What is claimed is:

1. A sawtooth generator adapted to produce a sawtooth voltage, comprising:
   a current source, coupled to a clock with a clock frequency, configured to produce a reference current proportional to said clock frequency from a source other than and without employing a feedback loop with said sawtooth voltage, said current source including a switched capacitor circuit with a first switched capacitor and a second switched capacitor configured to be switched out of phase with said first switched capacitor to produce said reference current with reduced ripple; and
   an active network including a switch and a capacitor coupled to said current source and configured to provide said sawtooth voltage with a waveform slope produced across said capacitor substantially proportional to said reference current and a waveform amplitude produced across said capacitor substantially independent of said clock frequency.

2. The sawtooth generator as recited in claim 1 wherein said switch is enabled to conduct to discharge said capacitor in response to a signal from said clock.

3. The sawtooth generator as recited in claim 1 wherein said switch is coupled across said capacitor.

4. The sawtooth generator as recited in claim 1 wherein said current source includes a switched capacitor circuit including a switched capacitor switched at said clock frequency to produce said reference current proportional to said clock frequency.

5. The sawtooth generator as recited in claim 1 wherein said current source includes a switched capacitor circuit including first and second capacitors, said second switched capacitor is configured to be switched out of phase with said first switched capacitor with non-overlapping phases.

6. The sawtooth generator as recited in claim 1 wherein said current source includes a current mirror coupled to said switched capacitor circuit to produce said reference current.

7. The sawtooth generator as recited in claim 1 wherein said active network includes a voltage source coupled in series with said switch to provide said sawtooth voltage with a dc offset voltage.

8. A method of producing a sawtooth voltage, comprising:
   producing a reference current with a current source, coupled to a clock, proportional to a clock frequency of said clock from a source other than and without employing a feedback loop with said sawtooth voltage, said current source including a switched capacitor circuit with a first switched capacitor and a second switched capacitor configured to be switched out of phase with said first switched capacitor to produce said reference current with reduced ripple; and providing said sawtooth voltage across a capacitor of an active network having a waveform slope substantially proportional to said reference current and a waveform amplitude produced across said capacitor substantially independent of said clock frequency.

9. The method as recited in claim 8 further comprising enabling a switch of said active network to conduct to discharge said capacitor in response to a signal from said clock.

10. The method as recited in claim 8 wherein said source includes a switched capacitor circuit including a switched capacitor switched at said clock frequency to produce said reference current proportional to said clock frequency.

11. The method as recited in claim 8 wherein said second switched capacitor is configured to be switched out of phase with said first switched capacitor with non-overlapping phases.

12. The method as recited in claim 8 wherein said current source includes a current mirror coupled to said switched capacitor circuit to produce said reference current.

13. The method as recited in claim 8 wherein said active network includes a voltage source coupled in series with a switch to provide said sawtooth voltage with a dc offset voltage.

14. A power converter coupled to a source of electrical power adapted to provide an input voltage thereto, comprising:
   a power train including a power switch coupled to said source of electrical power and configured to provide an output characteristic therefrom; and
   a controller configured to provide a signal to control a duty cycle of said power switch, including:
      a feedback amplifier configured to receive said output characteristic and a reference signal and produce a threshold signal,
      a waveshaping circuit configured to receive a synchronization signal and produce phase signals therefrom,
      a sawtooth generator adapted to receive said phase signals and produce a sawtooth voltage, including:
         a current source configured to produce a reference current proportional to a frequency of said synchronization signal from a source other than and without employing a feedback loop with said sawtooth voltage, said current source including a switched capacitor circuit with a first capacitor and a second capacitor configured to be switched out of phase with said first capacitor to produce said reference current with reduced ripple, and
         an active network including a switch and a capacitor coupled to said current source and configured to provide said sawtooth voltage with a waveform slope produced across said capacitor substantially proportional to said reference current and a waveform amplitude produced across said capacitor substantially independent of said clock frequency, and
      a comparator configured to provide said signal to control said duty cycle as a function of said sawtooth voltage and said threshold signal.

15. The power converter as recited in claim 14 wherein said switch is enabled to conduct to discharge said capacitor in response to said synchronization signal.

16. The power converter as recited in claim 14 wherein said switch is coupled across said capacitor.

17. The power converter as recited in claim 14 wherein said current source includes a switched capacitor circuit including a switched capacitor switched at said frequency to produce said reference current proportional to said frequency.

18. The power converter as recited in claim 14 wherein said second switched capacitor is configured to be switched out of phase with said first switched capacitor with non-overlapping phases.

19. The power converter as recited in claim 14 wherein said current source includes a current mirror coupled to said switched capacitor circuit to produce said reference current.

20. The power converter as recited in claim 14 wherein said active network includes a voltage source coupled in series with said switch to provide said sawtooth voltage with a dc offset voltage.

* * * * *